United States Patent
Kan (10) Patent No.: US 12,400,694 B2
(45) Date of Patent: Aug. 26, 2025

(54) CLOCK MULTIPLEXER DEVICE, CONTROLLER, AND STORAGE DEVICE

(71) Applicant: SK hynix Inc., Icheon-si (KR)

(72) Inventor: Shao Chun Kan, Zhubei (TW)

(73) Assignee: SK hynix Inc., Icheon-si (KR)

( * ) Notice: Subject to any disclaimer, the term of this patent is extended or adjusted under 35 U.S.C. 154(b) by 381 days.

(21) Appl. No.: 17/900,620

(22) Filed: Aug. 31, 2022

(65) Prior Publication Data

US 2024/0021228 A1 Jan. 18, 2024

(30) Foreign Application Priority Data

Jul. 14, 2022 (TW) .................. 111126420

(51) Int. Cl.
*G11C 7/22* (2006.01)
*G11C 7/10* (2006.01)

(52) U.S. Cl.
CPC ............ *G11C 7/222* (2013.01); *G11C 7/1012* (2013.01); *G11C 7/1066* (2013.01)

(58) Field of Classification Search
CPC ..... G11C 7/222; G11C 7/1012; G11C 7/1066; G11C 7/22; G11C 7/225
See application file for complete search history.

(56) References Cited

U.S. PATENT DOCUMENTS

| | | | |
|---|---|---|---|
| 6,956,793 B2 | 10/2005 | Ngo | |
| 6,975,145 B1 | 12/2005 | Vadi et al. | |
| 7,671,633 B2 | 3/2010 | Kuhn | |
| 7,793,179 B2 | 9/2010 | Sul | |
| 8,729,947 B2 | 5/2014 | Hwang et al. | |
| 9,154,142 B2 | 10/2015 | Dobbs et al. | |
| 9,612,611 B1 * | 4/2017 | Nakibly | G06F 1/04 |
| 9,753,486 B2 | 9/2017 | Stevens et al. | |
| 10,541,693 B2 | 1/2020 | Zerbe et al. | |

* cited by examiner

*Primary Examiner* — Alfredo Bermudez Lozada
(74) *Attorney, Agent, or Firm* — WILLIAM PARK & ASSOCIATES LTD.

(57) ABSTRACT

A clock multiplexer device, a controller and a storage device are provided. The clock multiplexer device comprises a clock switching timing controller and a clock multiplexer. The clock switching timing controller is configured to receive and operate at a reference clock signal being active and generate a clock switching trigger signal according to a plurality of clock signals, wherein the reference clock signal is independent of the plurality of clock signals. The clock multiplexer is for receiving the clock switching trigger signal and the plurality of clock signals, and selects one of the plurality of clock signals according to the clock switching trigger signal so as to output a target clock signal.

20 Claims, 6 Drawing Sheets

CLOCK MULTIPLEXER DEVICE, CONTROLLER, AND STORAGE DEVICE

CROSS-REFERENCE TO RELATED APPLICATION

The present application claims priority under 35 U.S.C. § 119(a) to Taiwanese Patent Application No. 111126420 filed on Jul. 14, 2022, in the Taiwan Intellectual Property Office, which is incorporated herein by reference in its entirety.

BACKGROUND OF THE INVENTION

1. Field of the Invention

The present disclosure relates to a clock multiplexer, and in particular to a clock multiplexer device, a controller and a storage device, which are suitable for devices for an interconnection protocol.

2. Description of the Related Art

The current electronic devices such as computing devices or communication devices often need their system circuits to switch to clocks with different operating frequencies in order to meet the specifications of power consumption, efficacy or application. A clock multiplexer is a circuit capable of switching a system circuit from one clock to another. Since the clock is related to the stability and correctness of the system operation, the undesirable instantaneous pulse or the signal of the unpredictable transition state, that is, the so-called glitch (or false signal) will cause danger to the system circuit, so the clock multiplexer is required to have no glitch. Therefore, clock multiplexers are also known as "glitchless multiplexers".

In general, the conventional clock multiplexer receives two clock signals, and selects one clock signal from the two clock signals according to a selection signal and outputs it. The clock multiplexer requires both clock signals to be active to operate. That is, if either of the two clock signals received by the clock multiplexer is inactive, the clock multiplexer will not operate normally.

BRIEF SUMMARY OF THE INVENTION

The following proposes a clock multiplexer device technology, suitable for electronic devices capable of supporting an interconnection protocol. By the technology, when any one of at least two clock signals received by the clock multiplexer device is inactive, the clock multiplexer device can still operate normally.

The following provides various embodiments according to the technology, such as a clock multiplexer device, controller, and storage device for an interconnection protocol.

The disclosure provides a clock multiplexer device, which comprises a clock switching timing controller and a clock multiplexer. The clock switching timing controller is configured to receive and operate at a reference clock signal being active and generate a clock switching trigger signal according to a plurality of clock signals, wherein the reference clock signal is independent of the plurality of clock signals, the plurality of clock signals including a first clock signal and a second clock signal. The clock multiplexer is for receiving the clock switching trigger signal and the plurality of clock signals, and selects one of the plurality of clock signals according to the clock switching trigger signal so as to output a target clock signal.

In some embodiments of the clock multiplexer device, the clock switching timing controller is configured to operate at the reference clock signal to generate the clock switching trigger signal so that the clock multiplexer selects one clock signal being active from the plurality of clock signals according to the clock switching trigger signal so as to output the target clock signal.

In some embodiments of the clock multiplexer device, the clock switching timing controller is configured to be operable at the reference clock signal to generate the clock switching trigger signal when the first clock signal is inactive and the second clock signal is active so that the clock multiplexer selects the second clock signal according to the clock switching trigger signal so as to output the target clock signal.

In some embodiments of the clock multiplexer device, the clock switching timing controller is configured to be operable at the reference clock signal to generate the clock switching trigger signal when the first clock signal is active and the second clock signal is inactive so that the clock multiplexer selects the first clock signal according to the clock switching trigger signal so as to output the target clock signal.

In some embodiments of the clock multiplexer device, the clock switching timing controller comprises: a first clock stop detection circuit, a second clock stop detection circuit, a first synchronization unit, a second synchronization unit and a control circuit. The first clock stop detection circuit is for detecting the first clock signal to generate a first indication signal. The second clock stop detection circuit is for detecting the second clock signal to generate a second indication signal. The first synchronization unit is configured to operate at the reference clock signal and generate a third indication signal according to the first indication signal. The second synchronization unit is configured to operate at the reference clock signal and generate a fourth indication signal according to the second indication signal. The control circuit is configured to operate at the reference clock signal and generate the clock switching trigger signal according to at least one of the third indication signal and the fourth indication signal.

In some embodiments of the clock multiplexer device, the first clock stop detection circuit is further configured to receive a first informing signal, operate at the first clock signal, and generate the first indication signal in response to the first informing signal; the second clock stop detection circuit is further configured to receive a second informing signal, operate at the second clock signal, and generate the second indication signal in response to the second informing signal.

In some embodiments of the clock multiplexer device, the first informing signal and the second informing signal are output from a physical layer of an interconnection protocol.

In some embodiments of the clock multiplexer device, the first clock signal and the second clock signal are used in a physical layer of an interconnection protocol, the reference clock signal is used in a link layer of the interconnection protocol.

The implementation provides a controller, for use in a first device that is linkable to a second device according to an interconnection protocol, the controller comprising: a hardware protocol engine and a clock multiplexer device. The hardware protocol engine is for implementing a link layer of the interconnection protocol and communicating with a physical layer of the interconnection protocol, wherein the link layer of the interconnection protocol utilizes a reference clock signal. The clock multiplexer device includes a clock switching timing controller and a clock multiplexer. The clock switching timing controller is configured to receive and operate at the reference clock signal being active, and generate a clock switching trigger signal according to a plurality of clock signals, wherein the reference clock signal is independent of the plurality of clock signals; the plurality of clock signals including a first clock signal and a second clock signal; the first clock signal and the second clock signal are used in the physical layer of the interconnection protocol. The clock multiplexer is for receiving the clock switching trigger signal and the plurality of clock signals, and selects one of the plurality of clock signals according to the clock switching trigger signal so as to output a target clock signal.

The implementation provides a storage device, operable to link to a host according to an interconnection protocol, the storage device comprising an interface circuit and a device controller. The interface circuit is for implementing a physical layer of the interconnection protocol so as to link to the host. The device controller is for being coupled to the interface circuit and a storage module, wherein the device controller comprises: a hardware protocol engine and a clock multiplexer device as in any one of the foregoing embodiments or a combination thereof. The hardware protocol engine is for implementing a link layer of the interconnection protocol and communicating with the interface circuit, wherein the link layer of the interconnection protocol utilizes a reference clock signal. The clock multiplexer device includes a clock switching timing controller and a clock multiplexer. The clock switching timing controller is configured to receive and operate at the reference clock signal being active, and generate a clock switching trigger signal according to a plurality of clock signals, wherein the reference clock signal is independent of the plurality of clock signals, the plurality of clock signals includes a first clock signal and a second clock signal, the first clock signal and the second clock signal are used in the physical layer of the interconnection protocol. The clock multiplexer is for receiving the clock switching trigger signal and the plurality of clock signals, and selects one of the plurality of clock signals according to the clock switching trigger signal so as to output a target clock signal.

In some embodiments, the interconnection protocol is Universal Flash Storage (UFS) standard.

DETAILED DESCRIPTION OF THE INVENTION

To facilitate understanding of the object, characteristics and effects of this present disclosure, embodiments together with the attached drawings for the detailed description of the present disclosure are provided, the description is as below.

Figure 1:
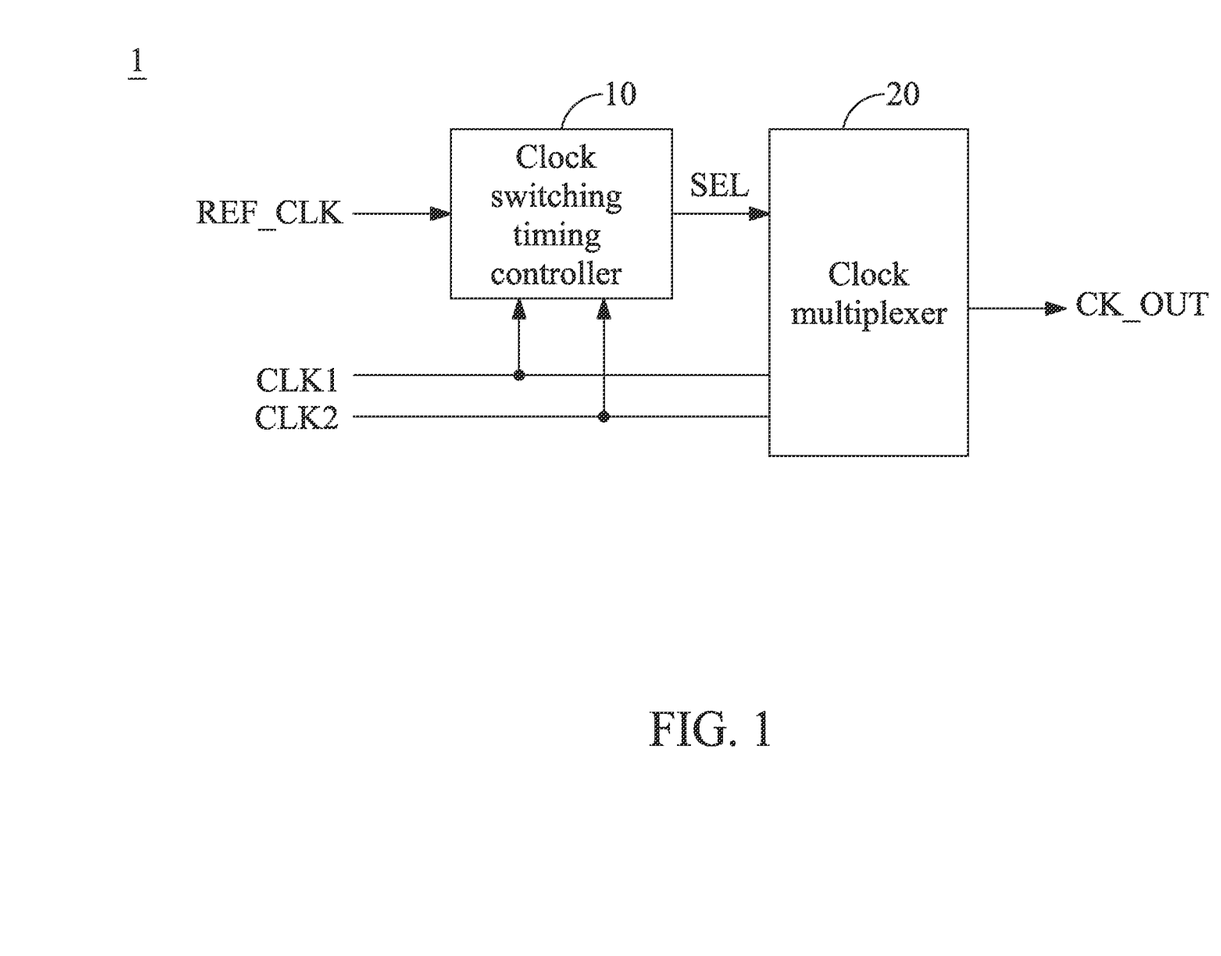
FIG. 1 is a schematic block diagram of a clock multiplexer device according to an embodiment.

Referring to FIG. 1, FIG. 1 is a schematic block diagram of a clock multiplexer device according to an embodiment of the present disclosure, which provides architecture of the clock multiplexer device. As shown in FIG. 1, the clock multiplexer device 1 comprises: a clock switching timing controller 10 and a clock multiplexer 20. The clock switching timing controller 10 is configured to receive and operate at a reference clock signal being active (e.g., represented as REF_CLK), and generate a clock switching trigger signal (e.g., represented as SEL) according to a plurality of clock signals, such as a first clock signal (e.g., represented as CLK1) and a second clock signal (e.g., represented as CLK2), wherein the reference clock signal REF_CLK is independent of the first clock signal CLK1 and the second clock signal CLK2. Therefore, even if one of the first clock signal CLK1 and the second clock signal CLK2 is inactive, the reference clock signal REF_CLK is still active, that is, it remains having normal pulse waves. The clock multiplexer 20 is used to receive a clock switching trigger signal SEL, a first clock signal CLK1, a second clock signal CLK2, and selects one of the first clock signal CLK1 and the second clock signal CLK2 according to the clock switching trigger signal SEL so as to output a target clock signal (represented as CLK_OUT).

The architecture of the clock multiplexer device 1 provided in FIG. 1 is suitable for electronic devices capable of supporting an interconnection protocol or any circuit that requires switching multiple clocks. Thus, even if any one of at least two clock signals received by the clock multiplexer device 1 is inactive, the clock multiplexer device 1 can still operate normally.

Figure 2:
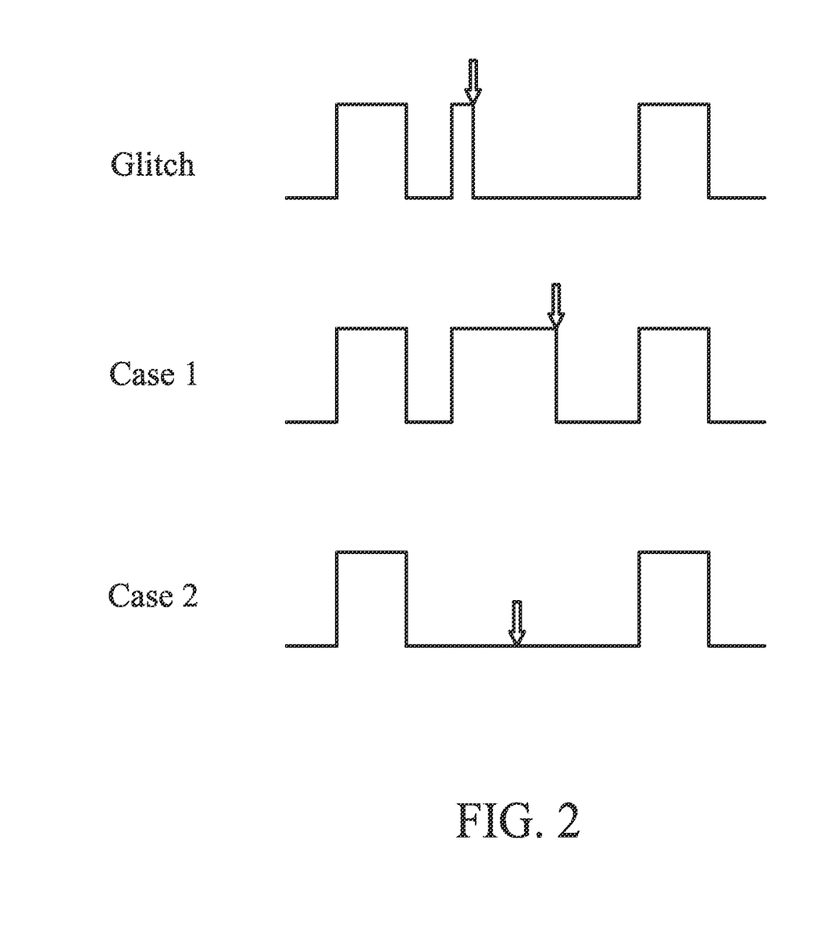
FIG. 2 is a schematic view of a glitch and clocks of a clock multiplexer device.

By contrast, both clock signals are required to be active for a conventional clock multiplexer to operate. That is, if any one of the two clock signals received by the conventional clock multiplexer is inactive, the clock multiplexer cannot operate normally. This is caused due to timing issues, and the conventional clock multiplexer always tries to stop outputting one clock and switch to another by synchronization and handshaking mechanisms, and to avoid a glitch as much as possible. Referring to FIG. 2, FIG. 2 is a schematic view of a glitch and output clocks of the clock multiplexer device 1. The upper waveform in FIG. 2 shows that a clock multiplexer switches from one clock to another at an inappropriate time point (such as the time point indicated by a downward arrow), which causes the glitch. In addition, in some application scenarios, it is inevitable that the original clock will stop or fail. Since the clock has stopped, the conventional clock multiplier that relies on synchronization and handshaking mechanisms is not operational. In contrast to the operations of the conventional clock multiplexer, in the architecture of the clock multiplexer device 1 provided in FIG. 1, the clock switching timing controller 10 is configured to receive and operate at a reference clock signal REF_CLK being active, and generate a clock switching trigger signal SEL, and adopt an approach to asynchronous clock switching to appropriately switch clocks by the clock switching trigger signal SEL, wherein the reference clock signal REF_CLK is independent of the first clock signal CLK1 and the second clock signal CLK2. Therefore, even if one of the first clock signal CLK1 and the second clock signal CLK2 is inactive, the reference clock signal REF_CLK is still active. That is, in the architecture of the clock multiplexer device 1 provided in FIG. 1, the clock is switched at a later time to control the switching timing and ensure that there is no glitch. As shown in case 1 of FIG. 2, it shows that when the clock multiplexer device 1 switches the clock at an appropriate time point (such as the time point indicated by the downward arrow), a normal pulse wave can be produced to avoid the glitch. As shown in case 2 of FIG. 2, it shows that when the clock multiplexer device 1 switches the clock at a more appropriate time point (such as the time point indicated by the downward arrow) and avoids occurrence of glitch.

The following embodiments illustrate various implementations of the architecture of the clock multiplexer device 1 based on FIG. 1.

In some embodiments based on the architecture of the clock multiplexer device 1 of FIG. 1, the clock switching timing controller 10 is configured to be able to find out the clock stop information and determine when to switch the clock signal without glitch when one of the first clock signal CLK1 and the second clock signal CLK2 is inactive.

In some embodiments based on the architecture of the clock multiplexer device 1 of FIG. 1, the clock switching timing controller 10 is configured to receive and operate at the reference clock signal REF_CLK being active and generate the clock switching trigger signal SEL, so that the clock multiplexer 20 selects one clock signal being active so as to output the target clock signal CLK_OUT according to the clock switching trigger signal SEL. That is, when the clock multiplexer device 1 is configured to switch from one current clock signal to a selected clock signal from the plurality of clock signals, as long as the selected clock signal is still active, the clock multiplexer device 1 can still select the selected clock signal being active to output the target clock signal CLK_OUT even if the current clock signal or other clock signals is inactive.

In some embodiments based on the architecture of the clock multiplexer device 1 of FIG. 1, the clock switching timing controller 10 is configured to be operable at the reference clock signal REF_CLK to generate the clock switching trigger signal SEL when the first clock signal CLK1 is inactive and the second clock signal CLK2 is active so that the clock multiplexer 20 selects the second clock signal CLK2 according to the clock switching trigger signal SEL so as to output the target clock signal CLK_OUT.

In some embodiments based on the architecture of the clock multiplexer device 1 of FIG. 1, the clock switching timing controller 10 is configured to be operable at the reference clock signal REF_CLK to generate the clock switching trigger signal SEL when the first clock signal CLK1 is active and the second clock signal CLK2 is inactive so that the clock multiplexer selects the first clock signal CLK1 according to the clock switching trigger signal SEL so as to output the target clock signal CLK_OUT.

Figure 3:
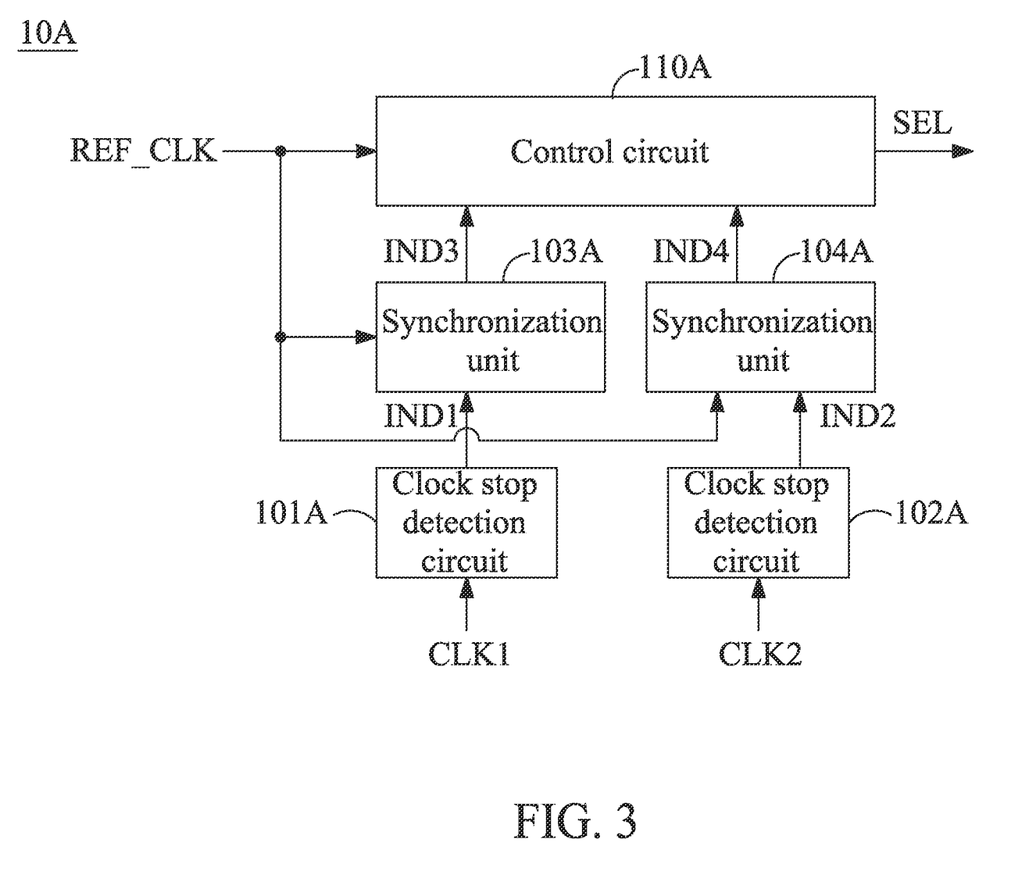
FIG. 3 is a schematic block diagram of a clock switching timing controller in FIG. 1 according to an embodiment.

Referring to FIG. 3, FIG. 3 is a schematic block diagram of a clock switching timing controller in FIG. 1 according to an embodiment. As shown in FIG. 3, the clock switching timing controller 10A comprises: clock stop detection circuits 101A-102A, synchronization units 103A-104A and a control circuit 110A. The clock stop detection circuit 101A is for detecting the first clock signal CLK1 to generate an indication signal IND1. The clock stop detection circuit 102A is for detecting the second clock signal CLK2 to generate an indication signal IND2. The synchronization unit 103A is configured to operate at the reference clock signal REF_CLK and generate an indication signal IND3 according to the indication signal IND1. The synchronization unit 104A is configured to operate at the reference clock signal REF_CLK and generate an indication signal IND4 according to the indication signal IND2. Further, the control circuit 110A is configured to operate at the reference clock signal REF_CLK and generate the clock switching trigger signal SEL according to the indication signal IND3 and the indication signal IND4. In FIG. 3, the clock stop detection circuits 101A-102A are configured to respectively produce a delay effect, when one of the first clock signal CLK1 and the second clock signal CLK2 (e.g., CLK1) is stopped, the indication signal (e.g., IND1 or IND2) will change the state after delaying for a period of time (e.g., at least one or more clock cycles) to indicate that the clock signal has stopped, so that the control circuit 110A produces the clock switching trigger signal SEL that is also delayed according to the indication signal (e.g., IND3 or IND4; or IND3 and IND4), which helps to prevent the target clock signal CK_OUT from having the occurrence of glitch. Each of the clock stop detection circuits 101A-102A and the synchronization units 103A-104A are each implemented by, for example, a circuit including two cascaded flip-flops or any other suitable circuit capable of generating the corresponding function.

In some embodiments, the clock stop detection circuit 101A further receives a first informing signal, the clock stop detection circuit 101A is configured to operate at the first clock signal CLK1, and generate the indication signal IND1 in response to the first informing signal; the clock stop detection circuit 102A further receives a second informing signal, the clock stop detection circuit 102A is configured to operate at the second clock signal CLK2, and generate the indication signal IND2 in response to the second informing signal. In some embodiments, the first informing signal and the second informing signal are output from a physical layer of an interconnection protocol.

In some embodiments based on the architecture of the clock multiplexer device of FIG. 1, the first clock signal CLK1 and the second clock signal CLK2 are used in a physical layer of an interconnection protocol, the reference clock signal REF_CLK is used in a link layer of the interconnection protocol.

In some embodiments of the clock multiplexer device, the interconnection protocol is Universal Flash Storage (UFS) standard.

Figure 4:
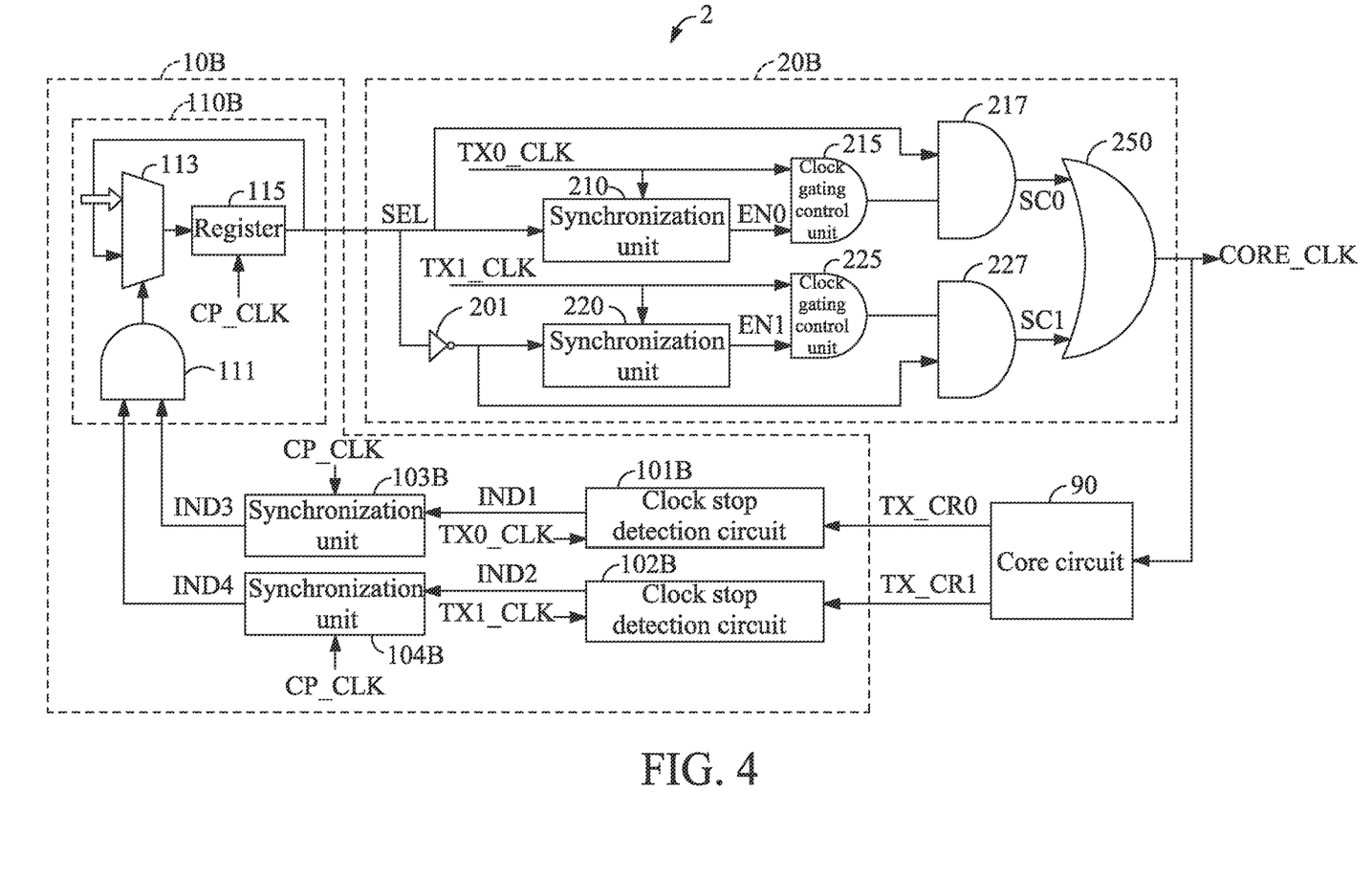
FIG. 4 is a schematic block diagram of an embodiment of a clock multiplexer device based on FIG. 1.

Referring to FIG. 4, FIG. 4 is a schematic block diagram of a clock multiplexer device based on an embodiment of FIG. 1. In the embodiment shown in FIG. 4, the clock multiplexer device 2 is applied in an electronic device capable of communicating according to an interconnection protocol. For example, the interconnection protocol is Universal Flash Storage (UFS) standard. The clock multiplexer device 2 is an embodiment based on the architecture of the clock multiplexer device 1 of FIG. 1. The clock multiplexer device 2 includes a clock switching timing controller 10B and a clock multiplexer 20B.

The clock switching timing controller 10B is configured to receive and operate at a reference clock signal being active, and generate a clock switching trigger signal according to a first clock signal and a second clock signal. In the embodiment of FIG. 4, the reference clock signal, for example, is CPort clock in the UniPro specification adopted by the UFS standard, expressed as CP_CLK. The first clock signal, for example, is TX symbol clock in the M-PHY specification adopted by the UFS standard that is allowed to be a clock of one frequency in a plurality of frequencies, expressed as TX0_CLK. The second clock signal, for example, is a clock of another frequency of the above-described TX symbol clock, expressed as TX1_CLK. In the UniPro specification, CPort clock CP_CLK is independent of the TX symbol clock TX0_CLK and the TX symbol clock TX1_CLK, and is configured to be active and not affected by other clocks. Therefore, even if one of the TX symbol clocks TX0_CLK and TX1_CLK is inactive, the CPort clock CP_CLK is still active.

The clock switching timing controller 10B comprises: clock stop detection circuits 101B-102B, synchronization units 103B-104B, and a control circuit 110B. The clock stop detection circuit 101B is used to detect the TX symbol clock TX0_CLK to generate an indication signal IND1; for example, the clock stop detection circuit 101B is configured to operate at the TX symbol clock TX0_CLK and receive a first informing signal (such as a signal TX_CR0), and generate the indication signal IND1 in response to the first informing signal. The clock stop detection circuit 102B is used to detect the TX symbol clock TX1_CLK to generate an indication signal IND2; for example, the clock stop detection circuit 102B is configured to operate at the TX symbol clock TX1_CLK and receive a second informing signal (such as a signal TX_CR1), and generate the indication signal IND2 in response to the second informing signal. For example, the first informing signal and the second informing signal are output from a physical layer (e.g., a physical layer circuit of the M-PHY specification adopted by the UFS standard) implementing an interconnection protocol (e.g., UFS standard) in an electronic device, such as a signal in accordance with the UniPro specification or M-PHY specification. For example, the first informing signal and the second informing signal are signals compliant with Reference M-PHY Module Interface (RMMI), such as i_rmmi_tx_cfg_rdy_n that indicate whether the transmission configuration at the physical layer (M-PHY) is ready or not.

Compared with the clock stop detection circuits 101B and 102B, the synchronization units 103B and 104B are configured to operate at CPort clock CP_CLK. Further, the synchronization unit 103B is used to generate an indication signal IND3 according to the indication signal IND1. The synchronization unit 104B is used to generate an indication signal IND4 according to the indication signal IND2.

Further, the control circuit 110B is configured to operate at CPort clock CP_CLK, and generate a clock switching trigger signal SEL according to the indication signal IND3 and the indication signal IND4. In order to respond the application scenario of an electronic device supporting the UFS standard shown in FIG. 4, for example, the control circuit 110B includes a logic gate 111, a multiplexer 113 and a register 115. The logic gate 111 performs logic operations according to the indication signal IND3 and the indication signal IND4, for example, a logic sum operation is used to generate a selection signal. The multiplexer 113 selects one of the signals at a first input end and a second input end of the multiplexer 113 according to the selection signal output by the logic gate 111, and outputs the selected one to the register 115. The first input end is used to receive parameter data, for example, parameters of the management information base (MIB) in the UniPro specification. The second input end is used to receive the signal output by the register 115. The register 115 is configured to operate at CPort clock CP_CLK, and generate a clock switching trigger signal SEL according to the output of the multiplexer 113. In FIG. 4, the clock stop detection circuits 101B-102B are configured to respectively produce a delay effect, when one of the TX symbol clock TX0_CLK or TX1_CLK (e.g., TX0_CLK) stops, the indication signal (e.g., IND1 or IND2) changes its state after delaying for a period of time (e.g., at least one or more clock cycles) to indicate that the clock signal has stopped, so that the control circuit 110B produces the clock switching trigger signal SEL that is also delayed according to the indication signal (e.g., IND3 or IND4; or IND3 and IND4), which helps to prevent the target clock signal CORE_OUT from having the occurrence of glitch. For example, the delay effect of the clock stop detection circuits 101B-102B makes the pulse wave of the target clock signal CORE_CLK will only occur as shown in the scenario of case 1 or case 2 in FIG. 2, ensuring that there is no glitch.

The clock multiplexer 20B is used to receive the clock switching trigger signal SEL, TX symbol clocks TX0_CLK and TX1_CLK, and selects one of the TX symbol clocks TX0_CLK and TX1_CLK according to the clock switching trigger signal SEL so as to output a target clock signal. The target clock signal, for example, is represented as CORE_CLK. As shown in FIG. 4, the clock multiplexer 20B includes an inverter 201, a synchronization unit 210, a clock gating control unit 215, a logic gate 217, a synchronization unit 220, a clock gating control unit 225, a logic gate 227, and a logic gate 250. The inverter 201 is used to generate an inversion signal of the clock switching trigger signal SEL according to the clock switching trigger signal SEL. The synchronization unit 210 is configured to operate at TX symbol clock TX0_CLK, and generates a corresponding enable signal EN0 according to the clock switching trigger signal SEL. The clock gating control unit 215, for example, based on a logic AND gate, is used to receive the TX symbol clock TX0_CLK and the enable signal EN0, and outputs a gated TX symbol clock TX0_CLK only if the enable signal EN0 is asserted. The logic gate 217, for example, a logic AND gate, is used for receiving the clock switching trigger signal SEL and the signal output by the clock gating control unit 215 to generate a signal SC0. The synchronization unit 220 is configured to operate at TX symbol clock TX0_CLK, and generates a corresponding enable signal EN1 according to the inversion signal of the clock switching trigger signal SEL. The clock gating control unit 225, for example, based on a logic AND gate, is used to receive the TX symbol clock TX1_CLK and the enable signal EN1, and output a gated TX symbol clock TX0_CLK only if the enable signal EN1 is asserted. The logic gate 227, for example, a logic AND gate, is used for receiving the inversion signal of the clock switching trigger signal SEL and the signal output by the clock gating control unit 225 to generate a signal SC1. The logic gate 250, for example, a logic OR gate, is used for receiving the signals SC0 and SC1 output by the logic gates 217 and 227 to output the target clock signal CORE_CLK.

For example, the clock multiplexer device 2 in the embodiment of FIG. 4 is used in an electronic device capable of communicating according to an interconnection protocol, the interconnection protocol such as the UFS standard, the following takes the TX symbol clock TX0_CLK switching to the TX symbol clock TX1_CLK as an example, and the description is as follows.

At the beginning, the TX symbol clocks TX0_CLK and TX1_CLK are active. In a certain scenario of establishing communication, for example, in a process of establishing a link between the electronic device (e.g., a storage device) and another electronic device (e.g., a host) through communication of the interconnection protocol, the lane 1 in the link is determined and the TX symbol clock TX1_CLK is used as the clock of lane 1, so it is necessary to stop using the TX symbol clock TX0_CLK of the lane 0 that is set initially. To this end, a core circuit 90 for implementing a physical layer (e.g., M-PHY) in the electronic device uses i_rmmi_tx_cfg_rdy_n signal to inform the clock multiplexer device 2 the situation whether the relevant configuration is ready or not. For example, i_rmmi_tx_cfg_rdy_n[0] and i_rmmi_tx_cfg_rdy_n[1] in FIG. 4 are respectively represented by signals TX_CR0 and TX_CR1, and respectively indicate whether the transmission configurations of lane 0 and lane 1 are ready or not, and are output by the core circuit 90. After the i_rmmi_tx_cfg_rdy_n signal changes from high level to low level, the TX symbol clock TX0_CLK will stop, the clock stop detection circuit 101B and the synchronization unit 210 will become inoperable. It can be seen that the conventional clock multiplexer is not suitable for operating in this situation.

Although the TX symbol clock TX0_CLK has stopped, the TX symbol clock TX0_CLK is still active. Thus, the clock stop detection circuit 102B can still operate, and the clock switching trigger signal SEL delays for a period of time before indicating that the clock switching is to be performed through the synchronization unit 104B and the control circuit 110B. Because the TX symbol clock TX0_CLK has stopped, the original clock gating control unit 215 uses the clock switching trigger signal SEL asynchronously gating TX symbol clock TX0_CLK that cannot operate. However, the clock gating control unit 225 can still use the inversion signal of the clock switching trigger signal SEL asynchronously gating TX symbol clock TX1_CLK.

Even if the above gating method is asynchronous, it is harmless to the circuit or any timing problems, this is because the clock multiplexer device 2 changes the state of the clock switching trigger signal SEL to indicate the TX symbol clock TX0_CLK to be selected after delaying for several cycles of the TX symbol clock TX1_CLK. The synchronous unit 220 responds to the change of the state of the clock switching trigger signal SEL, so that the clock gating control unit 225 outputs the TX symbol clock TX0_CLK, and the logic gate 250 accordingly outputs the target clock signal CORE_CLK. The clock multiplexer device 2 can effectively avoid the glitch when switching the clock at an appropriate time point.

Figure 5:
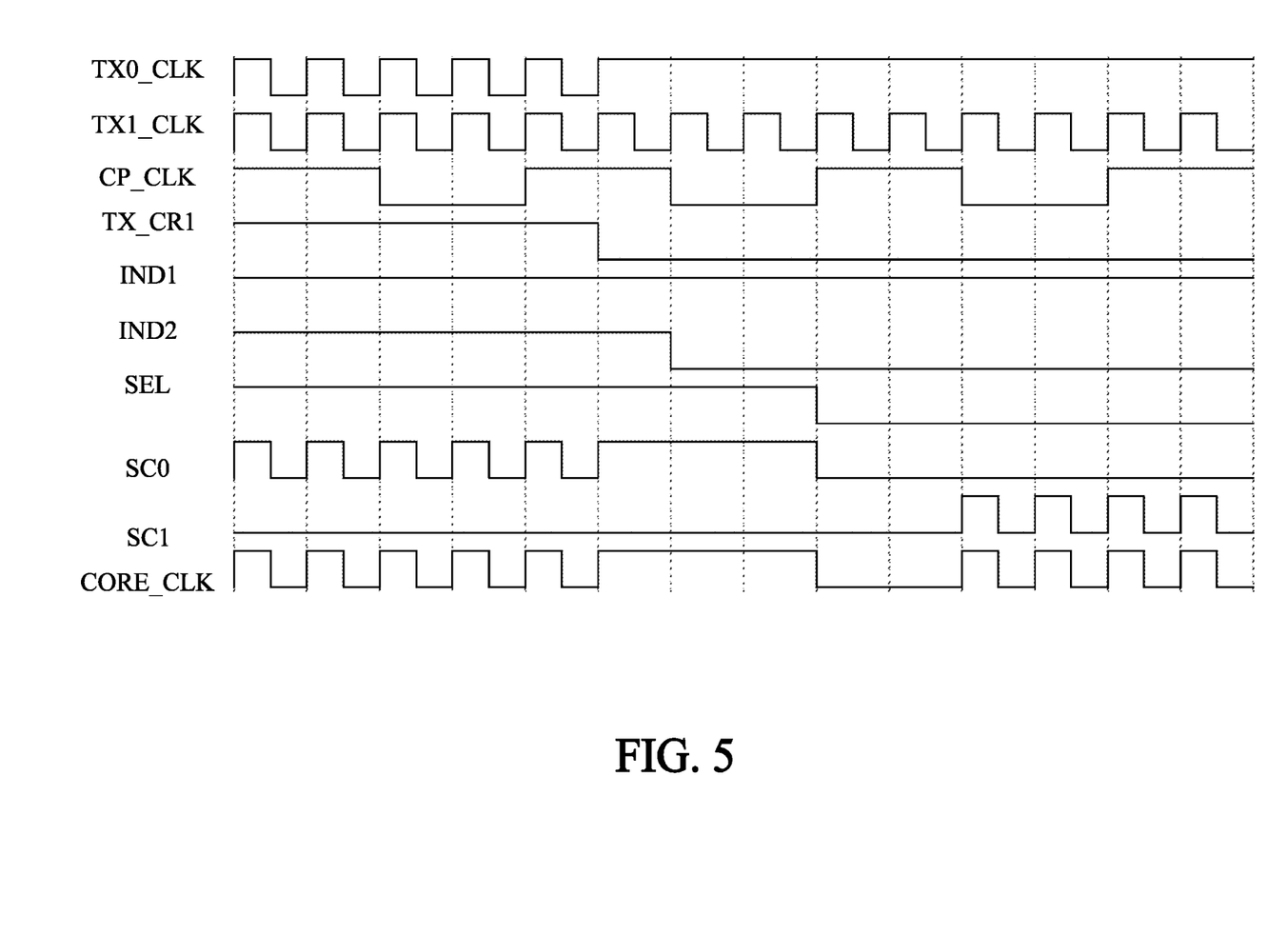
FIG. 5 is a schematic view of waveforms of the clock multiplexer device of FIG. 4.

Referring to FIG. 5, FIG. 5 is a schematic view of waveforms of the clock multiplexer device 2 of FIG. 4, wherein an example of a plurality of signals (e.g., TX0_CLK, TX1_CLK, CP_CLK, TX_CR1, IND1, IND2, SEL, SC0, SC1, CORE_CLK) is provided. As indicated in FIG. 5, the clock switching trigger signal SEL is driven according to the indication signal IND1 or the indication signal IND2, wherein the clock stop detection circuit 101B is implemented as a flag indicating whether the TX symbol clock TX0_CLK has stopped and outputs the indication signal IND1 to reflect a state whether the clock has stopped, the clock stop detection circuit 102B is implemented as a flag indicating whether the TX symbol clock TX0_CLK has stopped, and outputs the indication signal IND2 to reflect a state whether the clock has stopped. Since the TX symbol clock TX0_CLK has stopped (as shown in FIG. 5, it becomes a high level after some cycles), the indication signal IND1 cannot be set to be asserted. However, the indication signal IND2 can be set to be asserted. As a result, the target clock signal CORE_CLK shows that when the clock switching trigger signal SEL is set to be de-asserted, it produces a longer pulse instead of a glitch.

Further, referring to FIG. 4 again, the first input end of the multiplexer 113 in the control circuit 110B is for receiving parameter data, for example, the parameters of the management information base (MIB) in the UniPro specification. In the above scenario of establishing communication, the parameter data of the management information base (MIB) is also accompanied by a i_rmmi_tx_cfg_rdy_n signal indicating that the relevant configuration is ready to be completed and the state is changed, from representing the default TX symbol clock TX0_CLK to using lane 1 and using the TX symbol clock TX1_CLK as the clock of lane 1. In the embodiment of FIG. 4, the control circuit 110B carries out logic operations according to the indication signal IND3 and the indication signal IND4, for example, a logic sum operation of the logic gate 111 is used to generate a selection signal, so that the multiplexer 113 delays the timing of outputting the parameter data that has already been converted. Further, the control circuit 110B uses the action of the buffer provided by the register 115 to stably output the output signal of the multiplexer 113 as the clock switching trigger signal SEL. Thus, the glitch can be effectively avoided. Conversely, if the control circuit 110B generates a clock switching trigger signal SEL according to the parameter data, it is easy to generate the glitch, which may cause the risk of circuit operation errors. Certainly, the implementation of the present disclosure is not limited to the examples.

With respect to "asserting" (or an alternative thereof, such as "asserted" or "assertion") of a signal, it means that the signal is set to an active state (or active voltage level), which may be set to a high or low level. With respect to "de-asserting" (or an alternative thereof, such as "de-asserted" or "de-assertion") of the signal, it means that the signal is set to an inactive state (or inactive voltage level), which may be set to a high or low level. If the signal is active-low, the signal is "asserting" that means setting the signal to a low level and the signal is "de-asserting" that means setting the signal to a high level. If the signal is active-high, the signal is "asserting" that means setting the signal to a high level and the signal is "de-asserting" that means setting the signal to a low level.

Figure 6:
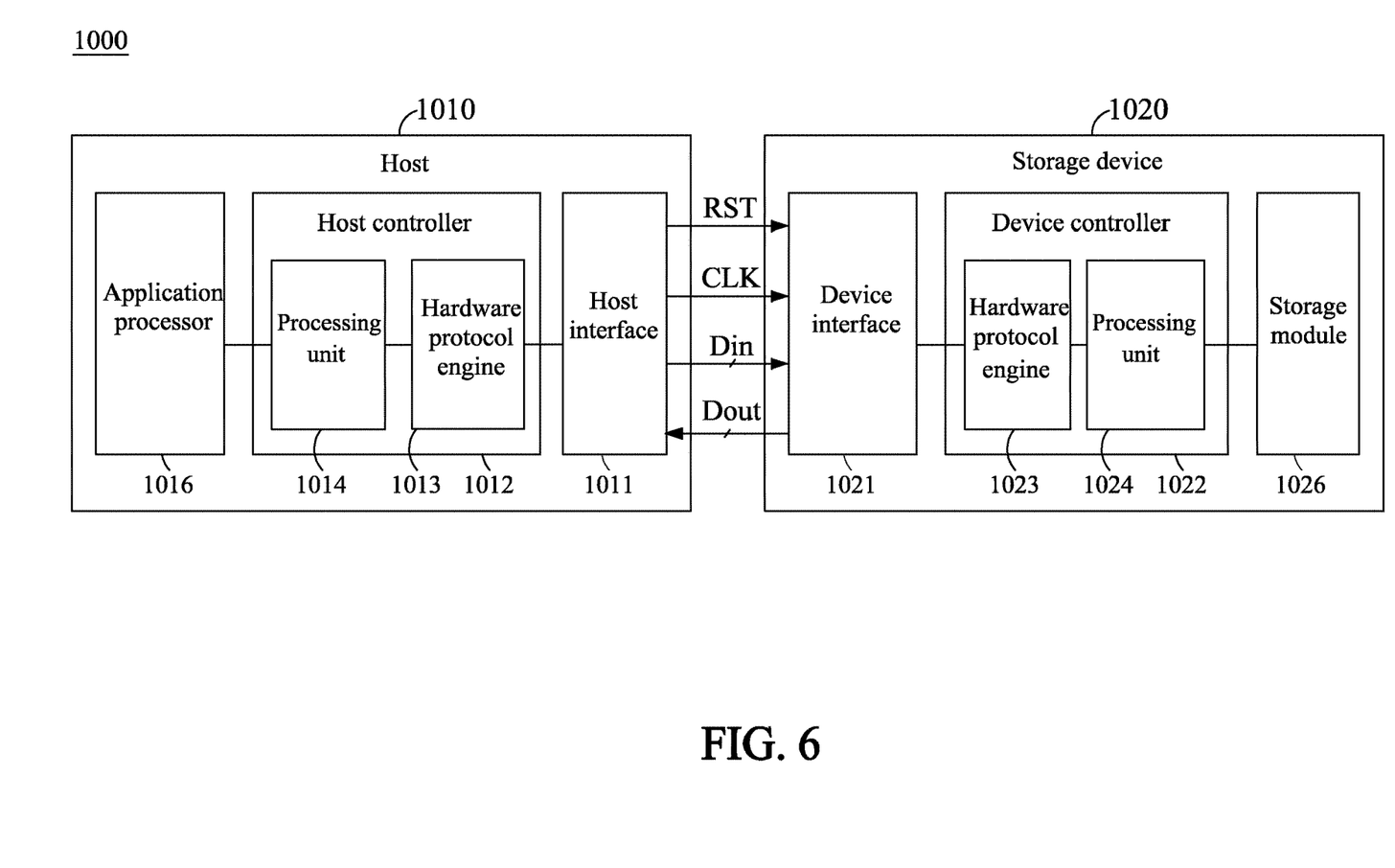
FIG. 6 is a schematic block diagram of a storage system according to an embodiment.

Referring to FIG. 6, FIG. 6 is a schematic block diagram of a storage system according to an embodiment of the disclosure. The following embodiments using circuit architecture of a storage system are illustrated.

For ease of understanding and explanation, the following further provides an embodiment of a circuit architecture based on the technique, which is flexible enough and can be efficiently configured to meet the needs of different products, in order to adapt to the design of various manufacturers and contribute to product development. As shown in FIG. 6, when such a circuit architecture is applied to the storage system 1000, a controller (e.g., a host controller 1012) of a host 1010 of the storage system 1000 or a controller (e.g., a device controller 1022) of a storage device 1020 of the storage system 1000 may be respectively implemented as a circuit architecture comprising a hardware protocol engine and a processing unit, wherein the processing unit of the controller is optional.

Referring to FIG. 6, FIG. 6 is a schematic block diagram of a storage system according to an embodiment of the present disclosure. As shown in FIG. 6, the storage system 1000 includes a host 1010 and a storage device 1020. The host 1010 and the storage device 1020 communicate therebetween through an interconnection protocol, thus allowing the host 1010 access data to the storage device 1020. The interconnection protocol, for example, is Universal Flash Storage (UFS) standard. The host 1010 is a computing device, for example, a smartphone, tablet, multimedia device. The storage device 1020, for example, is a storage device inside or outside the computing device, such as a storage device based on non-volatile memory. The storage device 1020 can write data under the control of the host 1010 or provide a written data to the host 1010. The storage device 1020 may be implemented as a solid-state storage device (e.g., SSD), multimedia card (MMC), embedded MMC (eMMC), secure digital (SD) card or Universal Flash Storage (UFS) device, however, the implementation of the present disclosure is not limited to the above examples.

The host 1010 includes a host interface 1011, a host controller 1012 and an application processor 1016.

The host interface 1011 is for implementing a physical layer of the interconnect protocol to link the storage device 1020. For example, the host interface 1011 is used to implement the physical (M-PHY) layer of UFS standard.

The host controller 1012 is coupled between the host interface 1011 and the application processor 1016. When the application processor 1016 needs to access data to the storage device 1020, it issues a corresponding access action instruction to the host controller 1012, and communicates with the storage device 1020 through the interconnection protocol, so as to achieve accessing data to the storage device 1020.

The host controller 1012 includes a hardware protocol engine 1013 and a processing unit 1014, wherein the processing unit 1014 is optional.

The hardware protocol engine 1013 is configured to implement a link layer for the interconnection protocol. Taking the interconnection protocol as UFS standard for example, the link layer is a Unified Protocol (UniPro) layer. The hardware protocol engine 1013 communicates and conducts information conversion with the host interface 1011 and the processing unit 1014 according to the specification of the link layer.

The processing unit 1014 is coupled to the hardware protocol engine 1013, configured to communicate with the application processor 1016. The processing unit 1014 may perform one or more firmware. For example, access action instructions that are issued by the operating system, driver or application performed by the application processor 1016 are converted to an instruction format of the link layer that conforms to the interconnection protocol through the firmware performed by the processing unit 1014, and then sent to hardware protocol engine 1013 for processing according to the specification of the link layer. The firmware, for example, is an internal memory that can be stored in the processing unit 1014, or an internal memory that is stored in the host controller 1012, wherein the internal memory may comprise volatile memory and non-volatile memory.

The storage device 1020 comprises a device interface 1021, a device controller 1022 and a storage module 1026.

The device interface 1021 is configured to implement a physical layer of the interconnection protocol so as to link to the host 1010. For example, the device interface 1021 is configured to implement the physical (M-PHY) layer of UFS standard.

The device controller 1022 is coupled between the device interface 1021 and the storage module 1026. The device controller 1022 may control a write operation, read operation or erase operation of the storage module 1026. The device controller 1022 may exchange data with the storage module 1026 through an address bus or data bus. The storage module 1026, for example, is a memory chip comprising one or more non-volatile memory.

The device controller 1022 comprises a hardware protocol engine 1023 and a processing unit 1024, wherein the processing unit 1024 is optional.

The hardware protocol engine 1023 is configured to implement a link layer for the interconnection protocol. Taking the interconnection protocol as UFS standard for example, the link layer is a UniPro layer. The hardware protocol engine 1023 communicates and conducts information conversion with the device interface 1021 and the processing unit 1024 according to the specification of the link layer.

The processing unit 1024 is coupled to the hardware protocol engine 1023, configured to communicate with the host 1010 through the device interface 1021. The processing unit 1024 may perform one or more firmware. For example, the processing unit 1024 performs one or more firmware to control or indicate the write operation, read operation or erase operation of the storage module 1026, processes messages from the hardware protocol engine 1023, or sends messages to the hardware protocol engine 1023. The firmware, for example, is an internal memory that can be stored in the processing unit 1024, an internal memory that is stored in the device controller 1022, or stored in a specific storage area of the storage module 1026, wherein the internal memory may comprise volatile memory and non-volatile memory.

As shown in FIG. 6, the host interface 1011 may be coupled to the device interface 1021 through data lines Din and Dout used to send/receive data, the reset line RST used to send hardware reset signals, and the clock line CLK used to send data. The data lines Din and Dout may be implemented as multiple pairs, and one pair of data lines Din or Dout can be called a lane. The host interface 1011 may communicate with the device interface 1021 by using at least one interface protocol, such as Mobile Industry Processor Interface (MIPI), Universal Flash Storage (UFS), Small Computer System Interface (SCSI) or Serial Attached SCSI (SAS), but the implementation of the present disclosure is not limited to the above examples.

Based on the controllers (e.g., host controller 1012 or device controller 1022) shown in FIG. 6, they may be respectively implemented as a circuit architecture including a hardware protocol engine and a processing unit.

In some embodiments according to FIG. 6, an embodiment provides a controller (such as, the host controller 1012 or the device controller 1022 of FIG. 6), for use in a first device that is linkable to a second device according to an interconnection protocol (e.g., UFS standard), and the controller comprises: a processing unit (such as, 1014 or 1024 of FIG. 6); and a clock multiplexer device (e.g., 1 of FIG. 1).

According to the embodiment of FIG. 6, the embodiment provides a storage device (e.g., 1020 of FIG. 6), capable of linking a host (e.g., 1010 of FIG. 6) according to an interconnection protocol (e.g., UFS standard), the storage device comprises: an interface circuit (e.g., 1021 of FIG. 6) and a device controller (e.g., 1022 of FIG. 6). The interface circuit is for implementing a physical layer of the interconnect protocol to link the host. The device controller is for coupling the interface circuit and a storage module, wherein the device controller comprises: a processing unit (e.g., 1024 of FIG. 6) and a clock multiplexer device 1 as in any one of the foregoing embodiments.

In some embodiments according to FIG. 6, an embodiment provides a controller (such as, the host controller 1012 or the device controller 1022 of FIG. 6), for use in a first device that is linkable to a second device according to an interconnection protocol (e.g., UFS standard), and the controller comprises: a hardware protocol engine (such as, 1013 or 1023 of FIG. 6); and a clock multiplexer device (such as, 1 of FIG. 1, 2 of FIG. 4 or others in the relevant embodiments) as in any one of the foregoing embodiments or a combination thereof.

According to the embodiment of FIG. 6, the embodiment provides a storage device (e.g., 1020 of FIG. 6), capable of linking a host (e.g., 1010 of FIG. 6) according to an interconnection protocol (e.g., UFS standard), the storage device comprises: an interface circuit (e.g., 1021 of FIG. 6) and a device controller (e.g., 1022 of FIG. 6). The interface circuit is for implementing a physical layer of the interconnect protocol to link the host. The device controller is for coupling the interface circuit and a storage module, wherein the device controller comprises: a hardware protocol engine (e.g., 1023 of FIG. 6); and a clock multiplexer device (such as, 1 of FIG. 1, 2 of FIG. 4 or others in the relevant embodiments) as in any one of the foregoing embodiments or a combination thereof.

Among them, the hardware protocol engine (e.g., 1013 or 1023 of FIG. 6) is used to implement a link layer of the interconnection protocol, and communicates with a physical layer of the interconnection protocol, wherein the link layer of the interconnection protocol uses a reference clock signal (such as the aforementioned CP_CLK or others). The clock multiplexer device comprises a clock switching timing controller and a clock multiplexer. The clock switching timing controller is configured to receive the reference clock signal and operate at the reference clock signal, and generate a clock switching trigger signal according to a plurality of clock signals. Among them, the reference clock signal is independent of the clock signals, the clock signals comprise a first clock signal and a second clock signal, the first clock signal and the second clock signal are used in the physical layer of the interconnection protocol. Even if one of the first clock signal and the second clock signal is inactive, the reference clock signal is still active and is not affected by other clock signals. The clock multiplexer is used to receive the clock switching trigger signal, the first clock signal and the second clock signal, and selects one of the first clock signal and the second clock signal according to the clock switching trigger signal so as to output a target clock signal.

To cite an example, the clock multiplexer device (e.g., 1 of FIG. 1) may be disposed or implemented in the controller (e.g., host controller 1012 or device controller 1022) of FIG. 6. For example, the clock multiplexer device (e.g., 1 of FIG. 1) may be implemented in the hardware protocol engine 1013 or the hardware protocol engine 1023 of FIG. 6. Further, for example, the clock multiplexer device (e.g., 1 of FIG. 1) may be disposed or implemented in the controller (e.g., host controller 1012 or device controller 1022) of FIG. 6, and outside the hardware protocol engine (e.g., 1013 or 1023) of FIG. 6. Further, for example, the clock multiplexer device (e.g., 1 of FIG. 1) may be disposed or implemented in the processing unit (e.g., 1014 or 1024 of FIG. 6) of the controller (e.g., host controller 1012 or device controller 1022) of FIG. 6.

Certainly, the implementation of the present disclosure is not limited by the above examples; various embodiments may be combined in various cases where are appropriate. Further, in some embodiments based on the above description, the clock multiplexer device (e.g., 1 of FIG. 1, 2 of FIG. 4 or others in relevant embodiments) may be further configured to comprise a clock switching timing controller and a clock multiplexer. The clock switching timing controller is configured to operate at a reference clock signal and generate a clock switching trigger signal according to a plurality of clock signals, wherein the reference clock signal is configured to be independent of the plurality of clock signals, therefore, even if one of the clock signals is inactive, the reference clock signal is still active and is not affected by other clock signals. The clock multiplexer is used to receive the clock switching trigger signal and the clock signals, and selects one of the clock signals according to the clock switching trigger signal so as to output a target clock signal, wherein the number of the clock signals may be two, three or more. To cite an example, when the clock multiplexer device implements a clock switching timing controller based on FIG. 3 or FIG. 4 to apply to three or more clock signals, each clock signal may further imitate such as the clock signal CLK2 and set up a corresponding circuit element such as the clock stop detection circuit 102A and the synchronization unit 104A. Further, as to the implementation of the clock multiplexer of the clock multiplexer device, each clock signal may further imitate such as the clock signal TX0_CLK and set up a corresponding circuit element such as the synchronization unit 210, the clock gating control unit 215 and the logic gate 217. Further, the clock multiplexer device may also be configured with a clock switching timing controller and a clock multiplexer as needed to generate one or more clock switching trigger signal SEL or clock switching trigger signal representing multiple states to select one of the plurality of clock signals.

In addition, in the above embodiments for the host and the storage device, the hardware protocol engine in the host controller or device controller can be designed based on technologies of any other design method using a hardware description language (HDL) such as the Verilog language or digital circuit familiar to those skilled in the art, and can be implemented based on the use of field programmable gate array (FPGA), or one or more circuits such as application specific integrated circuit (ASIC) or complex programmable logic device (CPLD), can also be implemented by using proprietary circuits or modules. The host controller or device controller (or a processing unit or hardware protocol engine thereof) can also be implemented based on a microcontroller, processor, or digital signal processor.

While the present disclosure has been described by means of preferable embodiments, those skilled in the art should understand the above description is merely embodiments of the disclosure, and it should not be considered to limit the scope of the disclosure. It should be noted that all changes and substitutions which come within the meaning and range of equivalency of the embodiments are intended to be embraced in the scope of the disclosure. Therefore, the scope of the disclosure is defined by the claims.

What is claimed is:

1. A device comprising:
   a controller configured to operate at a reference clock signal and generate a clock switching trigger signal according to a plurality of clock signals, the reference clock signal independent of the plurality of clock signals, wherein the reference clock signal is a CPort clock signal used in a link layer of an interconnection protocol, and the plurality clock signals are TX symbol clock signals used in a physical layer of the interconnection protocol; and
   a multiplexer configured to receive the clock switching trigger signal and the plurality of clock signals and select one of the plurality of clock signals according to the clock switching trigger signal to output a target clock signal.

2. The device according to claim 1, wherein the controller is configured to operate at the reference clock signal to generate the clock switching trigger signal such that the multiplexer selects one clock signal from the plurality of clock signals according to the clock switching trigger signal to output the target clock signal.

3. The device according to claim 1, wherein the plurality of clock signals includes a first clock signal and a second clock signal, and wherein the controller is configured to operate at the reference clock signal to generate the clock switching trigger signal when the first clock signal is inactive and the second clock signal is active such that the multiplexer selects the second clock signal according to the clock switching trigger signal to output the target clock signal.

4. The device according to claim 1, wherein the plurality of clock signals includes a first clock signal and a second clock signal, and wherein the controller is configured to operate at the reference clock signal to generate the clock switching trigger signal when the first clock signal is active and the second clock signal is inactive such that the multiplexer selects the first clock signal according to the clock switching trigger signal to output the target clock signal.

5. The device according to claim 1, wherein the plurality of clock signals includes a first clock signal and a second clock signal, and wherein the controller comprises:
a first clock stop detection circuit for detecting the first clock signal to generate a first indication signal;
a second clock stop detection circuit that detects the second clock signal to generate a second indication signal;
a first synchronization unit configured to operate at the reference clock signal and generate a third indication signal according to the first indication signal;
a second synchronization unit configured to operate at the reference clock signal and generate a fourth indication signal according to the second indication signal; and
a control circuit configured to operate at the reference clock signal and generate the clock switching trigger signal according to at least one of the third indication signal and the fourth indication signal.

6. The device according to claim 5, wherein
the first clock stop detection circuit is further configured to receive a first informing signal, operate at the first clock signal, and generate the first indication signal in response to the first informing signal; and
the second clock stop detection circuit is further configured to receive a second informing signal, operate at the second clock signal, and generate the second indication signal in response to the second informing signal.

7. The device according to claim 6, wherein the first informing signal and the second informing signal are output from a physical layer of an interconnection protocol.

8. The device according to claim 1, wherein the interconnection protocol is Universal Flash Storage (UFS) standard.

9. The device according to claim 1, wherein, when one or more of the plurality of clock signals is inactive, the reference clock signal is active.

10. The device according to claim 1, wherein the controller comprises:
a first synchronization unit configured to operate at the reference clock signal and generate a first clock indication signal based on a first clock signal of the plurality of clock signals;
a second synchronization unit configured to operate at the reference clock signal and generate a second clock indication signal based on a second clock signal of the plurality of clock signals; and
a control circuit configured to operate at the reference clock signal and generate the clock switching trigger signal according to at least one of the first clock indication signal and the second clock indication signal.

11. A device controller comprising:
a hardware protocol engine configured according to a link layer of the interconnection protocol and communicating with a physical layer of the interconnection protocol, wherein the link layer of the interconnection protocol utilizes a reference clock signal; and
a device including:
a controller configured to operate at the reference clock signal and generate a clock switching trigger signal according to a plurality of clock signals, the reference clock signal independent of the plurality of clock signals; and
a multiplexer configured to receive the clock switching trigger signal and the plurality of clock signals and select one of the plurality of clock signals according to the clock switching trigger signal to output a target clock signal;
wherein the reference clock signal is a CPort clock signal used in the link layer, and the plurality clock signals are TX symbol clock signals used in the physical layer.

12. The device controller according to claim 11, wherein the plurality of clock signals including a first clock signal and a second clock signal, and wherein the controller is configured to operate at the reference clock signal to generate the clock switching trigger signal when one clock signal of the first clock signal and the second clock signal is inactive and another clock signal of the first clock signal and the second clock signal is active such that the multiplexer selects the another clock signal according to the clock switching trigger signal to output the target clock signal.

13. The device controller according to claim 11, wherein the plurality of clock signals including a first clock signal and a second clock signal, and wherein the controller comprises:
a first clock stop detection circuit that detects the first clock signal to generate a first indication signal;
a second clock stop detection circuit that detects the second clock signal to generate a second indication signal;
a first synchronization unit configured to operate at the reference clock signal and generate a third indication signal according to the first indication signal;
a second synchronization unit configured to operate at the reference clock signal and generate a fourth indication signal according to the second indication signal; and
a control circuit configured to operate at the reference clock signal and generate the clock switching trigger signal according to at least one of the third indication signal and the fourth indication signal.

14. The device controller according to claim 13, wherein
the first clock stop detection circuit is further configured to receive a first informing signal, operate at the first clock signal, and generate the first indication signal in response to the first informing signal; and
the second clock stop detection circuit is further configured to receive a second informing signal, operate at the second clock signal, and generate the second indication signal in response to the second informing signal.

15. The device controller according to claim 14, wherein the first informing signal and the second informing signal are output from the physical layer of the interconnection protocol.

16. The device controller according to claim 11, wherein the interconnection protocol is Universal Flash Storage (UFS) standard.

17. A storage device comprising:
an interface circuit configured according to a physical layer of an interconnection protocol to link to a host;
a device controller coupled to the interface circuit and a storage module, wherein the device controller comprises:

a hardware protocol engine configured according to a link layer of the interconnection protocol and communicating with the interface circuit, wherein the link layer of the interconnection protocol utilizes a reference clock signal; and a device including:

a controller configured to operate at the reference clock signal and generate a clock switching trigger signal according to a plurality of clock signals, the reference clock signal independent of the plurality of clock signals; and a multiplexer configured to receive the clock switching trigger signal and the plurality of clock signals and select one of the plurality of clock signals according to the clock switching trigger signal to output a target clock signal;

wherein the reference clock signal is a CPort clock signal used in the link layer of the interconnection protocol, and the plurality clock signals are TX symbol clock signals used in the physical layer.

18. The storage device according to claim 17, wherein the plurality of clock signals including a first clock signal and a second clock signal, and wherein the controller is configured to operate at the reference clock signal to generate the clock switching trigger signal when one clock signal of the first clock signal and the second clock signal is inactive and another clock signal of the first clock signal and the second clock signal is active such that the multiplexer selects the another clock signal according to the clock switching trigger signal to output the target clock signal.

19. The storage device according to claim 17, wherein the interconnection protocol is Universal Flash Storage (UFS) standard.

20. The storage device according to claim 17, wherein the controller comprises:

a first synchronization unit configured to operate at the reference clock signal and generate a first clock indication signal based on a first clock signal of the plurality of clock signals;

a second synchronization unit configured to operate at the reference clock signal and generate a second clock indication signal based on a second clock signal of the plurality of clock signals; and a control circuit configured to operate at the reference clock signal and generate the clock switching trigger signal according to at least one of the first clock indication signal and the second clock indication signal.

* * * * *